(12) United States Patent
Inoue et al.

(10) Patent No.: US 9,717,168 B2
(45) Date of Patent: Jul. 25, 2017

(54) COMPOSITE CABLE MOUNTED IN INDUSTRIAL ROBOT

(71) Applicant: FANUC CORPORATION, Minamitsuru-gun, Yamanashi (JP)

(72) Inventors: Toshihiko Inoue, Yamanashi (JP); Shunsuke Abiko, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 0 days.

(21) Appl. No.: 14/994,756

(22) Filed: Jan. 13, 2016

(65) Prior Publication Data

US 2016/0205816 A1  Jul. 14, 2016

(30) Foreign Application Priority Data

Jan. 14, 2015  (JP) .................................. 2015-005375

(51) Int. Cl.

| H01B 7/00 | (2006.01) |
|---|---|
| H05K 9/00 | (2006.01) |
| H01B 7/17 | (2006.01) |
| H01B 7/04 | (2006.01) |
| B23K 9/32 | (2006.01) |
| H01B 9/00 | (2006.01) |

(52) U.S. Cl.
CPC .......... *H05K 9/0064* (2013.01); *B23K 9/323* (2013.01); *H01B 7/0045* (2013.01); *H01B 7/041* (2013.01); *H01B 7/17* (2013.01); *H01B 9/001* (2013.01)

(58) Field of Classification Search
CPC ...... H05K 9/0064; H01B 7/0045; H01B 7/17; H01B 11/12
See application file for complete search history.

(56) References Cited

U.S. PATENT DOCUMENTS

| 2,036,045 | A | * | 3/1936 | Harris | ....................... H01P 3/04 |
|---|---|---|---|---|---|
| | | | | | 174/103 |
| 3,281,571 | A | * | 10/1966 | Gilmore | ................ B23K 9/122 |
| | | | | | 174/47 |
| 3,992,565 | A | * | 11/1976 | Gatfield | ................ F16L 11/121 |
| | | | | | 174/115 |
| 4,487,996 | A | * | 12/1984 | Rabinowitz | ............ H01B 9/027 |
| | | | | | 174/105 R |

(Continued)

FOREIGN PATENT DOCUMENTS

| JP | 5313279 U | 2/1978 |
|---|---|---|
| JP | 63-125311 U1 | 8/1988 |

(Continued)

*Primary Examiner* — Steven T Sawyer
(74) *Attorney, Agent, or Firm* — RatnerPrestia

(57) ABSTRACT

Suppression of the effects of electromagnetic waves on the signals which are transmitted by signal lines and manufacturing composite cables more compactly and with higher efficiency have been sought. For this, provision is made of a composite cable 30 comprised of a center member 32 for supplying the fluid or wire material used for the work of the industrial robot, first signal lines 34 which are arranged at the outer circumferential side of the center member 32, a tubular shield 36 which surrounds the first signal lines 34 and shields them from electromagnetic waves, power lines 40 which are arranged at the outer circumferential side of the shield 36, and a tubular sheath 42 which surrounds the power lines 40.

5 Claims, 3 Drawing Sheets

(56) References Cited

U.S. PATENT DOCUMENTS

| | | | | |
|---|---|---|---|---|
| 4,538,022 A | * | 8/1985 | Barnicol-Ottler | H01B 7/04 |
| | | | | 174/113 C |
| 5,864,094 A | * | 1/1999 | Griffin | H01B 11/12 |
| | | | | 174/105 R |
| 6,195,487 B1 | * | 2/2001 | Anderson | G02B 6/4416 |
| | | | | 174/23 R |
| 6,310,286 B1 | * | 10/2001 | Troxel | H01B 9/003 |
| | | | | 174/102 R |
| 2005/0150883 A1 | * | 7/2005 | Tomiyasu | B23K 9/32 |
| | | | | 219/137.9 |
| 2010/0307785 A1 | * | 12/2010 | Kolasa | H01B 11/00 |
| | | | | 174/36 |
| 2014/0217067 A1 | * | 8/2014 | Basit | H01B 7/282 |
| | | | | 219/74 |
| 2015/0096401 A1 | | 4/2015 | Nagai et al. | |

FOREIGN PATENT DOCUMENTS

| | | |
|---|---|---|
| JP | H02-126513 A | 5/1990 |
| JP | 3-110719 U1 | 11/1991 |
| JP | H06-072119 U | 3/1994 |
| JP | 06072119 | 10/1994 |
| JP | 2003-230963 A | 8/2003 |
| JP | 2005158451 A | 6/2005 |
| JP | 2005-271003 A | 10/2005 |
| JP | 2012529727 A | 11/2012 |
| JP | 2013237428 A | 11/2013 |
| JP | 2014054727 A | 3/2014 |
| WO | 2014112349 A1 | 1/2017 |

* cited by examiner

COMPOSITE CABLE MOUNTED IN INDUSTRIAL ROBOT

BACKGROUND OF THE INVENTION

1. Field of the Invention

The invention relates to a composite cable mounted in an industrial robot.

2. Description of the Related Art

Various composite cables mounted in industrial robots are known (for example, Japanese Patent Publication No. 2003-230963A, Japanese Patent Publication No. 2005-271003A, Japanese Patent Publication No. 2-126513A, Japanese Utility Model Publication No. 6-72119U).

The above-mentioned composite cables are provided with signal lines and with power lines which transmit power larger than the signal lines. In the past, in such composite cables, suppression of the effects of electromagnetic waves on the signals which are transmitted by signal lines and manufacturing composite cables more compactly and with higher efficiency have been sought.

SUMMARY OF INVENTION

In an aspect of the invention, a composite cable mounted in an industrial robot comprises a center member for feeding a fluid or wire material used for a work of the industrial robot, a first signal line arranged at the outer circumferential side of the center member, a shield which surrounds the first signal line and blocks an electromagnetic wave, a power line arranged at the outer circumferential side of the shield, and a tubular sheath which surrounds the power line.

The composite cable may further comprise a second signal line arranged between the first signal line and the shield or between the shield and the power line. The center member may be a tubular member. The fluid or wire material may be arranged in the inner space of the center member. A plurality of the first signal lines may be arranged to align in the circumferential direction of the center member. A plurality of the power lines may be arranged to align in the circumferential direction of the shield.

DETAILED DESCRIPTION

Figure 1:
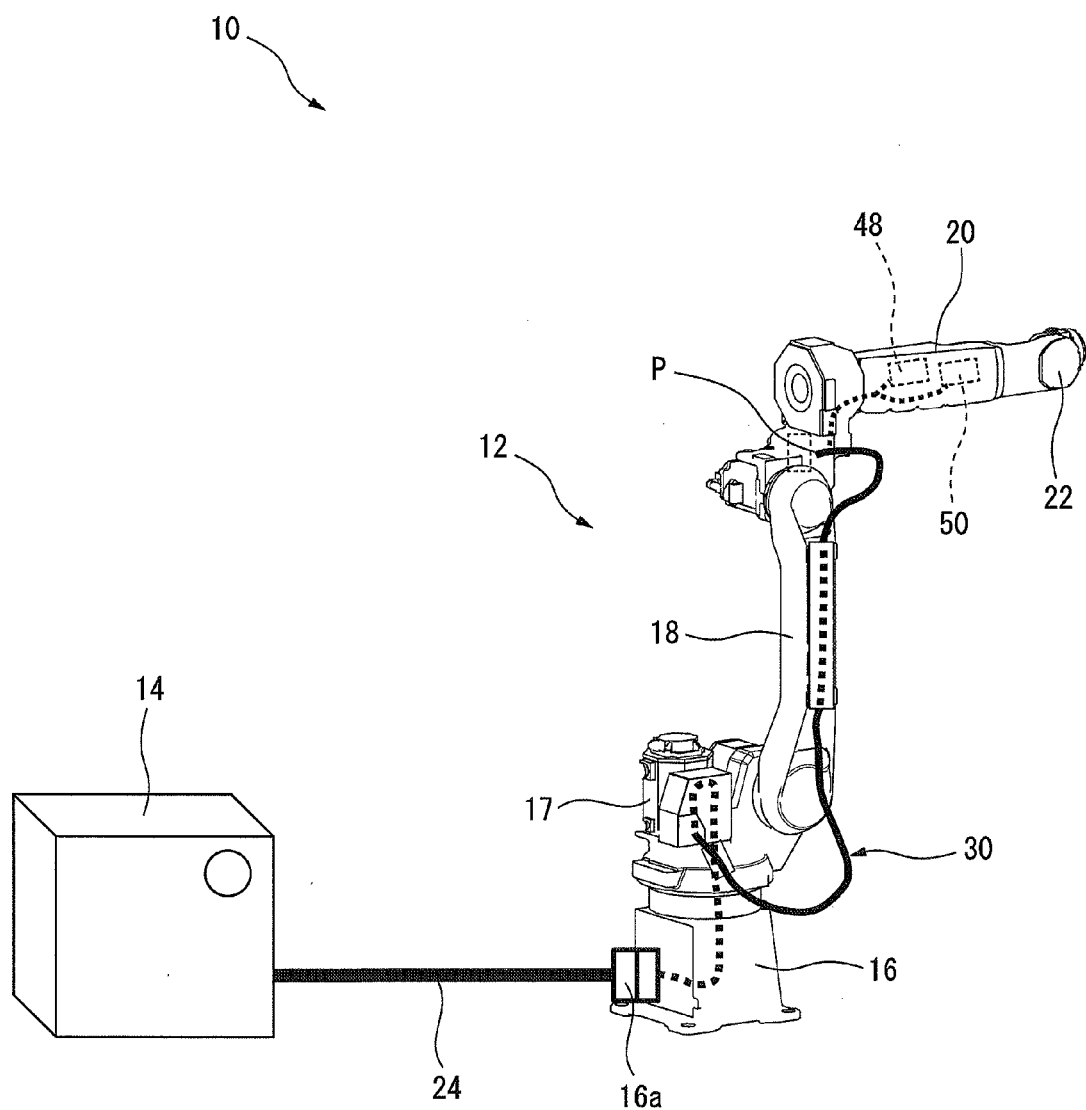
FIG. 1 is a view of a robot system in which a composite cable according to an embodiment of the invention is mounted.

Below, embodiments of the invention will be explained in detail based on the drawings. First, referring to FIG. 1, a robot system 10 will be explained. The robot system 10 is an industrial robot system for performing a work such as welding or machining, and includes a robot 12, a controller 14, and a composite cable 30.

The robot 12 includes a first base 16, a second base 17, an upper arm 18, a forearm 20, and a wrist 22. The first base 16 is fixed on a floor of a work cell. The second base 17 is attached to the first base 16 so as to be able to swivel about the vertical axis. The upper arm 18 is attached to the second base 17 so as to be rotatable about the horizontal axis. The forearm 20 is rotatably attached to the distal end of the upper arm 18.

The wrist 22 is attached to the distal end of the forearm 20. An end effecter (not shown), such as a welding torch, is attached to the wrist 22. The wrist 22 is driven by a servo motor so as to operate the end effecter to rotate the end effecter about three axes. The controller 14 directly or indirectly controls each element of the robot 12.

The composite cable 30 is laid so as to extend from a connector 16a provided at the first base 16 to a predetermined position at an element of the robot 12. On the other hand, the controller 14 and connector 16a are connected each other via a cable 24. In this embodiment, the composite cable 30 is laid from the connector 16a to a position P at the proximal end of the forearm 20.

Next, referring to FIG. 2, the configuration of the composite cable 30 will be explained. Note that, in the following explanation, the axial direction corresponds to a direction along the center axis O of the composite cable 30, while the radial direction corresponds to a direction along an imaginary line radially extending from the center axis O.

The composite cable 30 includes a center member 32, motor control-use signal lines (first signal lines) 34, a shield 36, general-use signal lines (second signal lines) 38, power lines 40, and a sheath 42. The center member 32 is a cylindrical member extending along the axis O.

The motor control-use signal lines 34 are arranged at the outer circumferential side of the center member 32. Specifically, a plurality of the motor control-use signal lines 34 are arranged on the outer circumferential surface 32a of the center member 32 so as to align in the circumferential direction of the center member 32.

Each of the motor control-use signal lines 34 includes two conductors 34a twisted together. Each of the motor control-use signal lines 34 extends in the axial direction.

The shield 36 is a cylindrical member extending in the axial direction, or a member produced by winding a tape member into a cylindrical shape. The shield 36 is arranged so as to surround the plurality of motor control-use signal lines 34 from radially outside. The shield 36 is made of a material capable of blocking an electromagnetic wave. The inner circumferential surface 36a of the shield 36 contacts a drain line 35. The drain line 35 is grounded at one end thereof so as to make the potential of the shield 36 to be a ground potential.

The general-use signal lines 38 are arranged at the outer circumferential side of the shield 36, i.e., arranged between the shield 36 and the power lines 40. Specifically, a plurality of the general-use signal lines 38 are arranged on the outer circumferential surface 36b of the shield 36 so as to align in the circumferential direction of the shield 36 at equal intervals.

A cylindrical partition member 44 is provided between the general-use signal lines 38 and the power lines 40. The partition member 44 is made of e.g. a paper material, and covers the general-use signal lines 38 from radially outside. The partition member 44 functions to divide the general-use signal lines 38 and power lines 40 into different radial layers.

The power lines 40 are arranged at the outer circumferential side of the shield 36. Specifically, a plurality of the power lines 40 are arranged at radially outside of the general-use signal lines 38 so as to align in the circumferential direction of the shield 36 at equal intervals.

The sheath 42 is a cylindrical member extending in the axial direction, and arranged so as to surround the power lines 40 from radially outside. The sheath 42 is made of e.g.

a plastic. The sheath 42 holds the motor control-use signal lines 34, the shield 36, the general-use signal lines 38, and the power lines 40 between the center member 32 and the sheath 42, in order to make the composite cable 30 to be an integral structure.

In this embodiment, a partition member 46 is interposed between the power lines 40 and sheath 42. This partition member 46 has a configuration similar to the above-mentioned partition member 44, and surrounds the power lines 40 from outside.

Next, referring to FIG. 1 and FIG. 2, the functions of the composite cable 30 according to this embodiment will be explained. As explained above, the composite cable 30 is laid from the connector 16a to the position P.

The motor control-use signal lines 34 of the composite cable 30 are electrically connected to the controller 14 via the cable 24 at first ends thereof, while connected to e.g. encoders (not shown) built in the servo motors 48 and 50 shown in FIG. 1 at second ends thereof. The servo motors 48 and 50 are mounted in the forearm 20 in order to drive the wrist 22.

The motor control-use signal lines 34 are wired so as to further extend from the position P to the inside of the forearm 20, pass through the inside of the forearm 20, and be connected to the above-mentioned encoders. The motor control-use signal lines 34 transmit signals from the encoders to the controller 14.

The general-use signal lines 38 are electrically connected to the controller 14 via the cable 24 at first ends thereof, while connected to the end effecter attached to the wrist 22 at second ends thereof. For example, the general-use signal lines 38 transmit various command signals from the controller 14 to the end effecter.

The power lines 40 are connected to the controller 14 via the cable 24 at first ends thereof, while connected to the servo motors 48 and 50 at second ends thereof. The power lines 40 transmit power for driving these servo motors 48 and 50. Note that, the power lines 40 may transmit power for driving brakes built in the servo motors 48 and 50.

The power for driving the servo motors 48 and 50 (or the power for driving the brakes) is greater than the power of the signal transmitted from the encoder to the controller 14 and the power of the command signal transmitted to the end effecter. Therefore, the power lines 40 are configured to be able to transmit signals having power larger than the signals transmitted by the motor control-use signal lines 34 and the general-use signal lines 38.

The center member 32 feeds the fluid or wire material to be used for the work of the robot 12. As an example, when a welding torch is attached to the wrist 22 and the robot 12 performs welding work on the workpiece, the center member 32 feeds an assist gas to the welding torch. Alternatively, the center member 32 accommodates e.g. a liner of a welding wire in the inner space thereof, and feeds it to the welding torch.

As another example, when a tool is attached to the wrist 22 and the robot 12 performs machining work on a workpiece, the center member 32 carries a compressed air in the inner space thereof, and feeds it to the tool.

Figure 2:
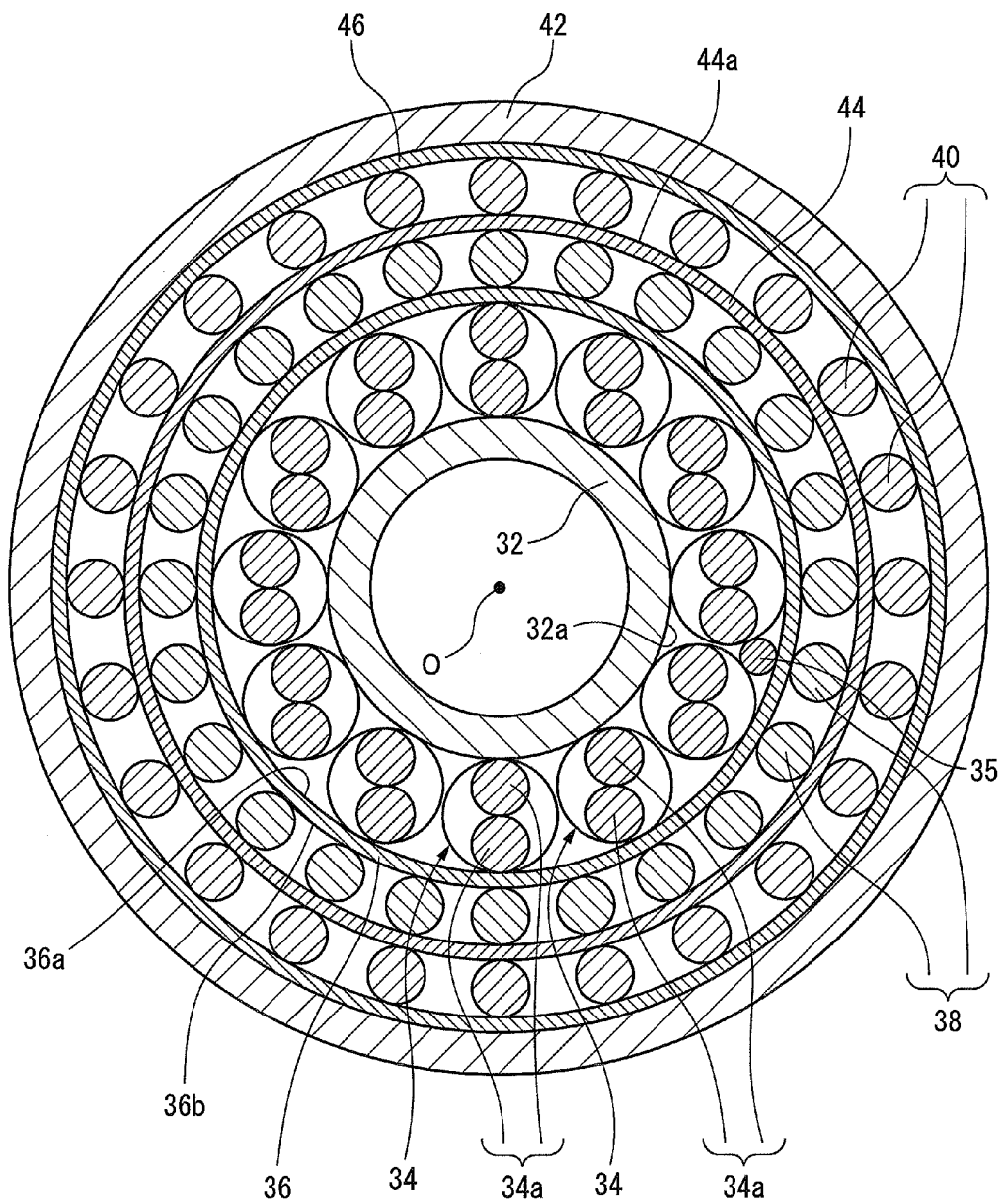
FIG. 2 is a cross-sectional view of a composite cable shown in FIG. 1.

As explained with FIG. 2, in this embodiment, the motor control-use signal lines 34, general-use signal lines 38, and power lines 40 are stacked in the radial direction so as to be substantially concentric with each other, and are held between the center member 32 and the sheath 42 to form an integral structure.

According to this configuration, since the dead space between the center member 32 and the sheath 42 can be reduced and the motor control-use signal lines 34, general-use signal lines 38, and power lines 40 can be densely held, it is possible to reduce the cross-sectional area of the composite cable 30.

Further, in this embodiment, the center member 32, motor control-use signal lines 34, general-use signal lines 38, and power lines 40 are made to be integral, so it is possible to reduce the number of cables to be dealt with, compared with the prior art where these lines are configured by separate cables for each type. Therefore, it is possible to simplify the work of installing the composite cable 30 to the robot 12.

Further, according to this embodiment, when forming the layers of the motor control-use signal lines 34, general-use signal lines 38, and power lines 40, the same type of wire material is used for the assembly work for each layer. Due to this, the manufacturing process of the composite cable 30 can be simplified.

Further, in this embodiment, the motor control-use signal lines 34 are arranged at radially inside of the shield 36, while the power lines 40 are arranged at radially outside of the shield 36. According to this configuration, the shield 36 can block both the electromagnetic wave propagated from the outside of the composite cable 30 toward radially inside of the composite cable 30 and the electromagnetic waves transmitted from the power lines 40 toward radially inside of the composite cable 30.

Due to this, the motor control-use signal lines 34 are shielded from not only the electromagnetic wave from the outside, but also the electromagnetic wave from the power lines 40. Therefore, it is possible to prevent noise, which propagate from the outside and the power lines 40, from interfering in the signals transmitted by the motor control-use signal lines 34.

Further, in this embodiment, the center member 32 is arranged at the center of the composite cable 30, and the motor control-use signal lines 34, the general-use signal lines 38, and power lines 40 are arranged at radially outside of center member 32. According to this configuration, the motor control-use signal lines 34, the general-use signal lines 38, and power lines 40 are arranged away from the center of the composite cable 30 which is susceptible to damage during the operation of the robot 12, so longer service life of the composite cable 30 can be realized.

Further, in this embodiment, the center member 32 for feeding the fluid or wire material used in the work of the robot 12 is built in the center of the composite cable 30. According to this configuration, the composite cable 30 can be configured more compactly. Further, a protective member for protecting the center member 32 from weld spatter or cutting dust becomes unnecessary, so the cost of the composite cable 30 can be cut.

In the above-mentioned embodiment, one shield 36 is provided between the motor control-use signal lines 34 and the general-use signal lines 38. However, the composite cable may be provided with a plurality of shields.

Such an embodiment will be explained with reference to FIG. 3. Note that, elements similar to the above-mentioned embodiments are assigned the same reference numerals, and detailed explanations thereof will be omitted. The composite cable 60 according to this embodiment is different from the above-mentioned composite cable 30 in the following matters.

The composite cable 60 includes a second shield 62, instead of the above-mentioned partition member 44. Specifically, the second shield 62 is arranged between the general-use signal lines 38 and the power lines 40, and surrounds the motor control-use signal lines 34 from outside. The second shield 62 is a cylindrical member which can block an electromagnetic wave, similar as the shield 36.

According to this embodiment, the second shield 62 can shield not only the motor control-use signal lines 34, but also the general-use signal lines 38 from electromagnetic waves from the outside and the power lines 40, so the motor control-use signal lines 34 and the general-use signal lines 38 can be kept from being influenced by the electromagnetic waves.

Figure 3:
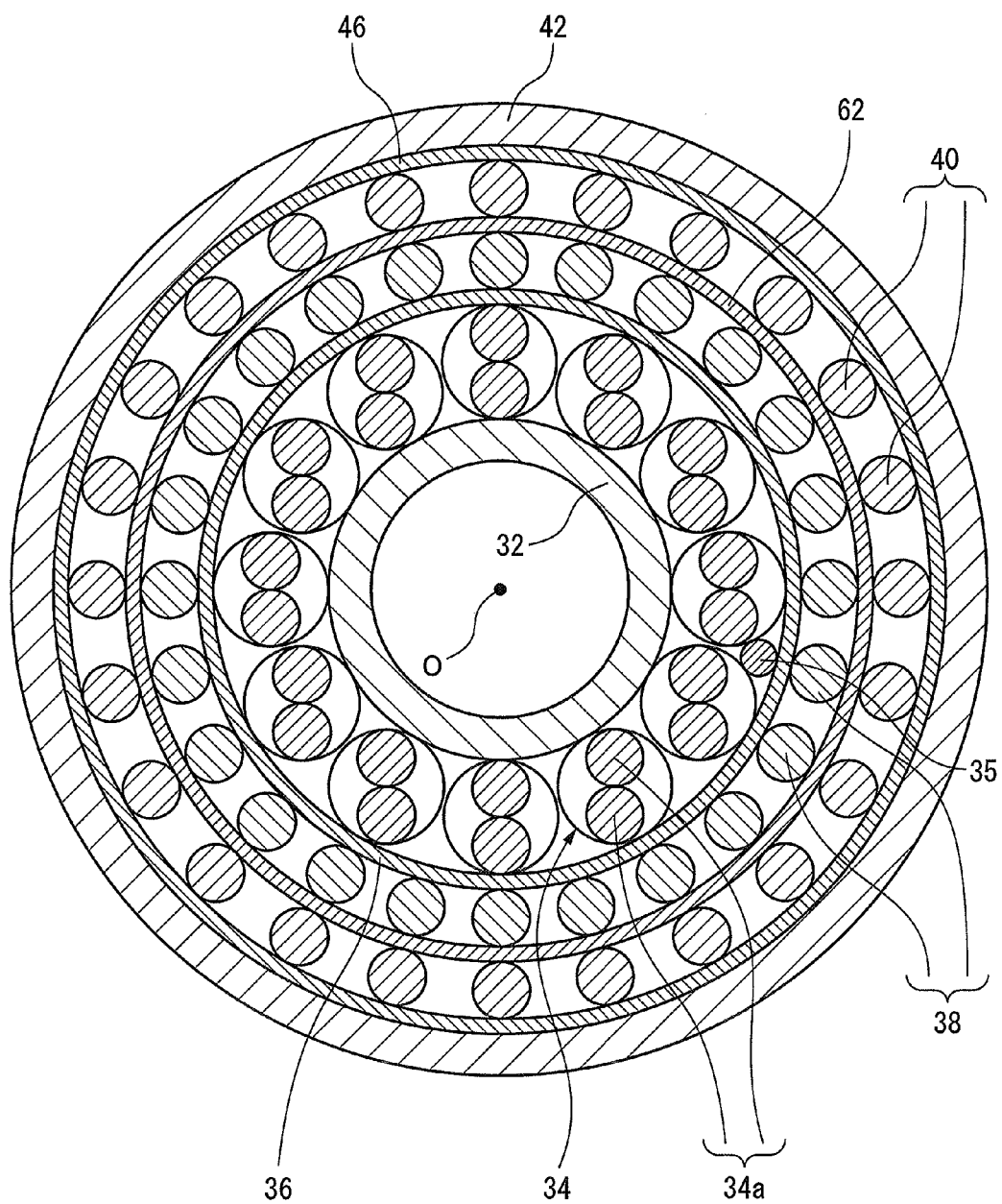
FIG. 3 is a cross-sectional view of a composite cable according to another embodiment of the invention.

Note that, in the composite cable 60 shown in FIG. 3, a tubular partition member may be applied, instead of the shield 36. In this case, the motor control-use signal lines 34 and the general-use signal lines 38 can be shielded from electromagnetic waves from outside of the composite cable and from the power lines.

Further, in the above-mentioned embodiments, the power lines 40 are connected to the servo motors 48 and 50 for driving the wrist 22. However, the power line may be connected to a servo motor for driving the upper arm 18, the forearm 20, or any other element of the robot 12.

Similarly, the motor control-use signal line 34 may be connected to an encoder built into any servo motor. Further, the motor control-use signal line 34 may be connected to e.g. a Hall element other than the encoder, or any other sensor (element) necessary for the operation of a servo motor.

Further, in the above-mentioned embodiment, the center member 32, the shields 36 and 62, and the sheath 42 are cylindrical. However, at least one of the center member 32, the shields 36 and 62, and the sheath 42 may be a polygonal or elliptical hollow member.

Further, the center member 32 may be a solid member. In this case, a wire material such as e.g. a liner of a welding wire may be embedded in the center member 32, and the wire material may be guided to a welding torch by the center member 32.

Above, embodiments of the invention were used to explain the invention, but the above embodiments do not limit the inventions according to the claims. Further, combinations of the features which are explained in the embodiments of the invention may also be included in the technical scope of the invention. However, not all of the combinations of these features are necessarily essential for the solution of the invention. Further, the fact that the above embodiments can be changed or improved in various ways would be clear to a person skilled in the art.

Further, it should be noted that the operations, routines, steps, stages, and other processing in the cable in the claims, specification, and drawings, unless particularly clearly indicated by "before", "in advance of", etc. or the output of prior processing being used for later processing, can be realized in any order. In the flow of operations in the claims, specification, and drawings, even if explained using "first", "next", etc. for convenience, this does not mean the execution in this order is essential.

The invention claimed is:

1. A composite cable mounted in an industrial robot, comprising:
    a center member for feeding towards an end effector of the industrial robot, during operation of the industrial robot, a fluid or welding wire material used by the end effector for a work of the industrial robot;
    a first signal line arranged at an outer circumferential side of the center member, and connected to an encoder or Hall element built in a servo motor which drives the industrial robot, the first signal line being configured to transmit a first signal from the encoder or the Hall element;
    a shield which surrounds the first signal line and blocks an electromagnetic wave;
    a second signal line arranged at an outer circumferential side of the shield, and connected to the end effector, the second signal line being configured to transmit a second signal different from the first signal;
    a power line arranged at an outer circumferential side of the second signal line;
    a partition member of paper material arranged between the second signal line and the power line so as to surround the second signal line, the partition member being configured to divide the second signal line and the power line into different layers; and
    a tubular sheath which surrounds the power line,
    wherein the composite cable is configured so that an electromagnetic wave propagated from the outside of the composite cable toward inside of the composite cable reaches the shield and is blocked by the shield.

2. The composite cable according to claim 1, further comprising a second signal line arranged between the first signal line and the shield or between the shield and the power line.

3. The composite cable according to claim 1, wherein the center member is a tubular member, the fluid or wire material is arranged in an inner space of the center member.

4. The composite cable according to claim 1, wherein a plurality of the first signal lines are arranged so as to align in the circumferential direction of the center member.

5. The composite cable according to claim 1, wherein a plurality of the power lines are arranged so as to align in the circumferential direction of the shield.

* * * * *